(12) United States Patent
Lee et al.

(10) Patent No.: US 8,946,808 B2
(45) Date of Patent: Feb. 3, 2015

(54) SEMICONDUCTOR DEVICE AND METHOD OF MANUFACTURING THE SAME

(75) Inventors: Ki Hong Lee, Gyeonggi-do (KR); Seung Ho Pyi, Gyeonggi-do (KR); Hyun Soo Shon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/603,339

(22) Filed: Sep. 4, 2012

(65) Prior Publication Data
US 2013/0207178 A1   Aug. 15, 2013

(30) Foreign Application Priority Data

Feb. 9, 2012 (KR) .......................... 10-2012-0013301
Apr. 3, 2012 (KR) .......................... 10-2012-0034471

(51) Int. Cl.
*H01L 29/792* (2006.01)
*H01L 29/76* (2006.01)
*H01L 29/788* (2006.01)
*H01L 21/4763* (2006.01)

(52) U.S. Cl.
USPC ............ 257/324; 257/314; 257/315; 438/594

(58) Field of Classification Search
CPC ................... H01L 27/11582; H01L 29/66833; H01L 29/7926
USPC .......... 257/324, 314, E29.309, 315; 438/478, 438/287, 594
See application file for complete search history.

(56) References Cited

U.S. PATENT DOCUMENTS

| | | | |
|---|---|---|---|
| 7,799,670 B2 | 9/2010 | Ramkumar et al. | |
| 2005/0063237 A1* | 3/2005 | Masuoka et al. | 365/222 |
| 2007/0184615 A1* | 8/2007 | Brazzelli et al. | 438/266 |
| 2008/0067583 A1* | 3/2008 | Kidoh et al. | 257/326 |
| 2008/0253187 A1* | 10/2008 | Aritome | 365/185.17 |
| 2009/0321813 A1 | 12/2009 | Kidoh et al. | |
| 2010/0072538 A1* | 3/2010 | Kito et al. | 257/326 |
| 2010/0276743 A1 | 11/2010 | Kuniya et al. | |
| 2011/0127597 A1* | 6/2011 | Fukuzumi et al. | 257/314 |
| 2012/0001345 A1* | 1/2012 | Park et al. | 257/774 |

FOREIGN PATENT DOCUMENTS

KR     100950478     3/2010

* cited by examiner

*Primary Examiner* — Long K Tran
*Assistant Examiner* — Dzung Tran
(74) *Attorney, Agent, or Firm* — IP & T Group LLP

(57) ABSTRACT

A semiconductor device includes word lines and interlayer insulating layers alternately stacked over a substrate, vertical channel layers protruding from the substrate and passing through the word lines and the interlayer insulating layers, a tunnel insulating layer surrounding each of the vertical channel layers, a charge trap layer surrounding the tunnel insulating layer, wherein first regions of the charge trap layer between the tunnel insulating layer and the word lines have a thickness smaller than a thickness of second regions thereof between the tunnel insulating layer and the interlayer insulating layers, and first charge blocking layer patterns surrounding the first regions of the charge trap layer.

9 Claims, 12 Drawing Sheets

SEMICONDUCTOR DEVICE AND METHOD OF MANUFACTURING THE SAME

CROSS-REFERENCE TO RELATED APPLICATION

Priority is claimed to Korean patent application numbers 10-2012-0013301 filed on Feb. 9, 2012, and 10-2012-0034471 filed on Apr. 3, 2012, the entire disclosure of which is incorporated herein by reference in its entirety.

BACKGROUND

1. Field of Invention

Embodiments of the present invention relate to a semiconductor device and a method of manufacturing the same and, more particularly, to a three-dimensional non-volatile memory device and a method of manufacturing the same.

2. Description of Related Art

A non-volatile memory device may retain data stored therein without a power supply. As two-dimensional memory devices having memory cells fabricated in the form of a single layer on silicon substrates reaches a limit in increasing the degree of integration, there are proposals of three-dimensional (3D) structured non-volatile memory devices that have memory cells vertically stacked on silicon substrates.

The structure of a conventional 3-D non-volatile memory device is described hereinafter in detail with reference to FIG. 1.

FIG. 1 is a cross-sectional view of a conventional 3-D non-volatile memory device. FIG. 1 illustrates a region in which memory cells are stacked.

As show in FIG. 1, the conventional 3-D non-volatile memory device may include vertical channel layers CH that protrude from a substrate (not shown) and a plurality of memory cells that are stacked along the vertical channel layers CH.

A method of forming the memory cells is described briefly hereinafter. First, sacrificial layers and interlayer insulating layers 11 are alternately formed and etched to form channel holes. Subsequently, the vertical channel layers CH are formed in the channel holes, and the sacrificial layers and the interlayer insulating layers 11 are etched to form slits between the vertical channel layers CH. Subsequently, the sacrificial layers exposed on inner walls of the slits are removed to form open regions, and a memory layer 12 is formed along the surface of the open regions. Here, the memory layer 12 comprises a charge blocking layer, a charge trap layer and a tunnel insulating layer, each of which is formed by a deposition process. Subsequently, the open regions in which the memory layer 12 is formed are filled with conductive layers 13. As a result, a plurality of memory cells are stacked over the substrate.

However, according to the known method of forming the memory cells as described above, since the open regions are filled with the conductive layers 13 after the memory layer 12 is formed along the inner surfaces of the open regions, the open regions are to be formed with ample spaces and thus the height of stacked layers may be increased, which may make it difficult to improve an integration degree of a memory device. In addition, since an insulating layer deposited by chemical vapor deposition is used as a charge blocking layer, the charge blocking layer may have low quality, thus deteriorating characteristics of the memory device.

BRIEF SUMMARY

Exemplary embodiments relate to a semiconductor device which is capable of improving an integration degree thereof by reducing the height of stacked layers, and a method of manufacturing the same.

A semiconductor device according to an embodiment of the present invention includes word lines and interlayer insulating layers alternately stacked over a substrate, vertical channel layers protruding from the substrate and passing through the word lines and the interlayer insulating layers, a tunnel insulating layer surrounding each of the vertical channel layers, a charge trap layer surrounding the tunnel insulating layer, wherein first regions of the charge trap layer between the tunnel insulating layer and the word lines have a thickness smaller than a thickness of second regions thereof between the tunnel insulating layer and the interlayer insulating layers, and first charge blocking layer patterns surrounding the first regions of the charge trap layer.

A method of manufacturing a semiconductor device according to another embodiment of the present invention includes alternately forming first material layers and second material layers, forming channel holes by etching the first material layers and the second material layers, forming a vertical channel layer, a tunnel insulating layer surrounding the vertical channel layer and a charge trap layer surrounding the tunnel insulating layer in each of the channel holes, forming a slit between the channel holes adjacent to each other by etching the first material layers and the second material layers, removing the first material layers exposed in the slit, forming first charge blocking layer patterns by oxidizing a given thickness of the charge trap layer exposed in regions from which the first material layers are removed, and forming conductive layers in the regions from which the first material layers are removed.

A method of manufacturing a semiconductor device according to yet another embodiment of the present invention includes alternately forming first material layers and second material layers, forming channel holes by etching the first material layers and the second material layers, forming first charge blocking layer patterns by oxidizing a given thickness of each of the first material layers exposed on inner surfaces of the channel holes, and forming a vertical channel layer, a tunnel insulating layer surrounding the vertical channel layer and a charge trap layer surrounding the tunnel insulating layer in each of the channel holes.

DESCRIPTION OF EMBODIMENTS

Hereinafter, various embodiments of the present invention will be described in detail with reference to the accompanying drawings. The figures are provided to enable those of ordinary skill in the art to make and use the present invention according to the exemplary embodiments of the present invention.

Figure 1:
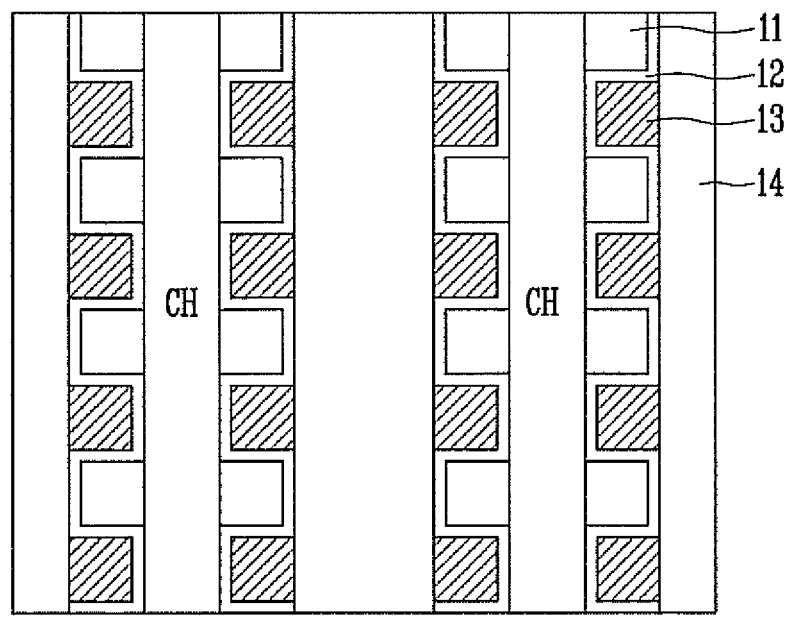
FIG. 1 is a cross-sectional view of a conventional three-dimensional (3-D) non-volatile memory device.
Figure 2A:
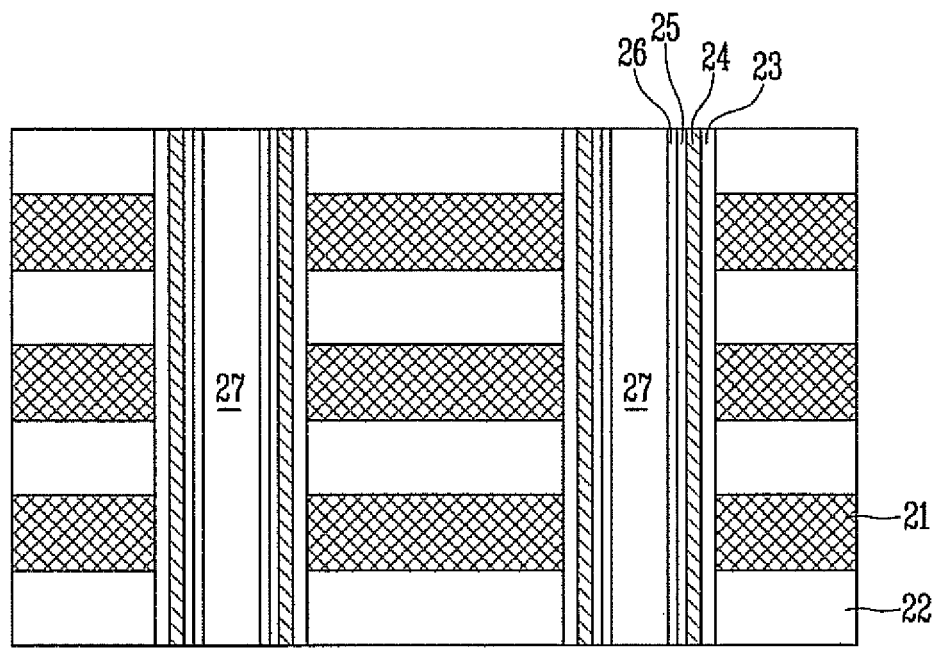
FIGS. 2A to 2C are cross-sectional views illustrating the process flow of a method of manufacturing a semiconductor device according to a first embodiment of the present invention.
Figure 2B:
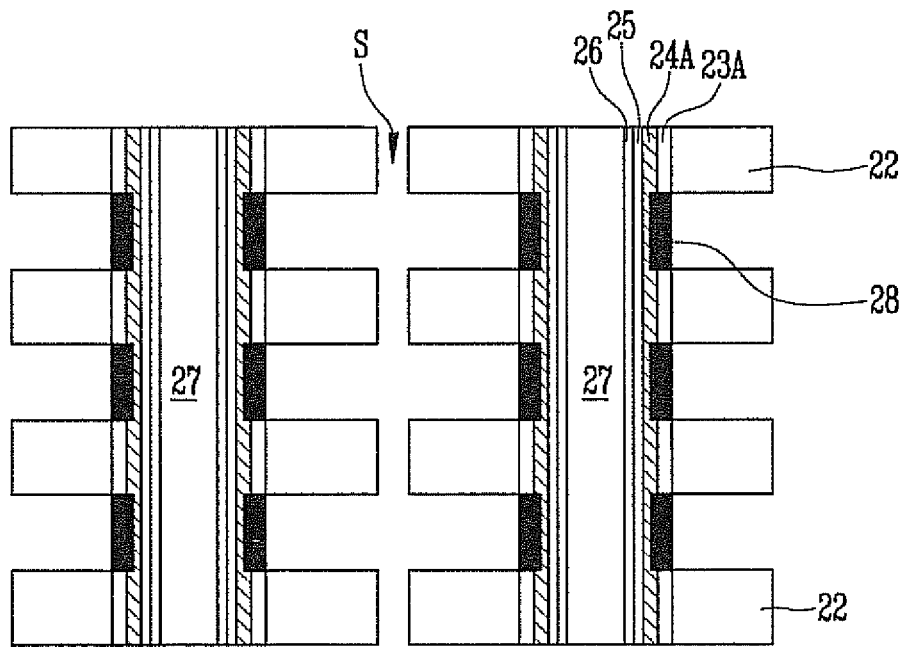
Figure 2C:
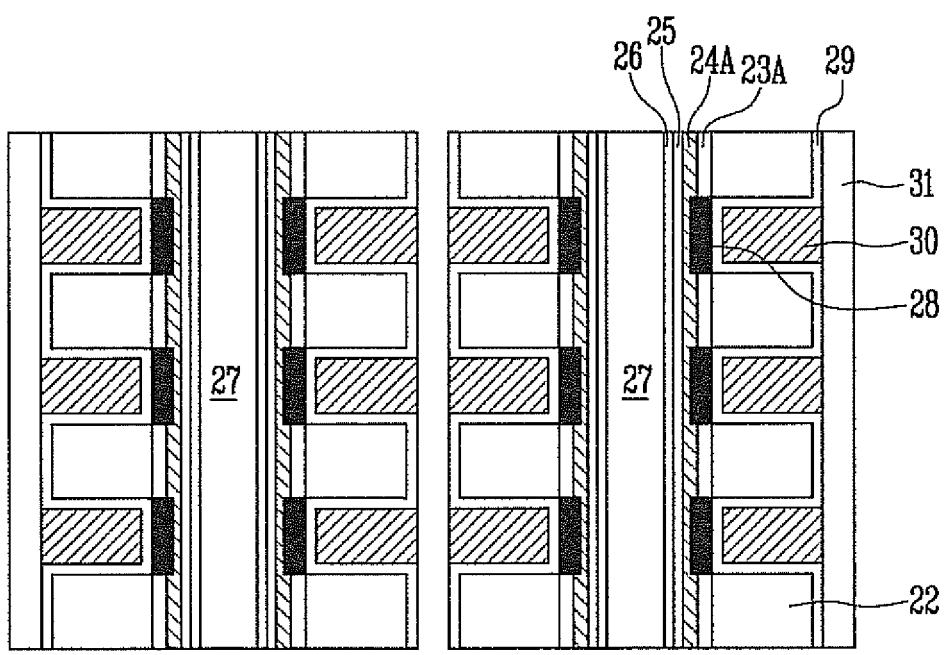

FIGS. 2A to 2C are cross-sectional views illustrating the process flow of a method of manufacturing a semiconductor device according to a first embodiment of the present invention. FIGS. 2A to 2C illustrate a region where memory cells are stacked.

As shown in FIG. 2A, first material layers 21 and second material layers 22 are alternately formed over a substrate (not shown) in which a given lower structure is formed. Here, the lower structure may include a source region and a pipe gate.

The first material layers 21 may be used to form word lines and selection lines. The second material layers 22 may be used to electrically insulate stacked word lines and selection lines from each other. The first material layers 21 and the second material layers 22 may be formed of materials having a high etch selectivity therebetween. In the first embodiment, the first material layer 21 may include a sacrificial layer such as a nitride layer, and the second material layer 22 may include an interlayer insulating layer such as an oxide layer.

Subsequently, the first material layers 21 and the second material layers 22 are etched to form channel holes. The channel holes are used to form vertical channel layers 26 and may be arranged in a matrix in view of a floor plane.

Subsequently, charge trap layers 24 may be formed along inner walls of the channel holes. Here, each of the charge trap layers 24 may have a uniform thickness along the inner wall of each of the channel holes. The charge trap layer 24 may be formed with sufficient thickness in consideration of a thickness of the charge trap layer 24 to be oxidized during subsequent processes of forming a first charge blocking layer. The charge trap layer 24 includes first regions at positions corresponding to the conductive layers 30 and second regions at positions corresponding to the second material layers 22. The first regions and the second regions are arranged alternately.

Subsequently, tunnel insulating layers 25 are formed on the charge trap layers 24. Each of the tunnel insulating layers 25 may be formed by using a deposition process or by oxidizing a given thickness of each of the charge trap layers 24. When the tunnel insulating layer 25 is formed by using an oxidation process, the interface between the tunnel insulating layer 25 and the charge trap layer 24 is not exposed to outside, thus improving interface characteristics.

Subsequently, the vertical channel layers 26 are formed on the tunnel insulating layers 25. Here, each of the vertical channel layers 26 may include a semiconductor layer. The vertical channel layer 26 may have a tubular shape having an open central portion. Alternatively, the vertical channel layer 26 may have the central portion completely filled up. When the vertical channel layer 26 has an open central portion, the open central portion is filled with an insulating layer 27 such as a flowable oxide layer.

Meanwhile, a buffer layer 23 may be formed along the inner walls of the channel holes before the charge trap layers 24 are formed. In the case that the buffer layer 23 is formed, the charge trap layers 24 may be prevented from being damaged during the subsequent process of removing the first material layers 21.

As shown in FIG. 2B, the first material layers 21 and the second material layers 22 are etched to form slits S between the vertical channel layers 26. Here, the slit S may be formed between each two adjacent vertical channel layers 26. Alternatively, the slits S may be formed between a certain number of the vertical channel layers 26.

Subsequently, the first material layers 21 exposed on inner walls of the slits S are removed to form open regions. Here, a word line or a selection line is formed in each of the open regions. For example, when the first material layers 21 include nitride layers, and the second material layers 22 include oxide layers, the first material layers 21 may be selectively removed by using a phosphoric acid solution while the second material layers 22 remain.

As the first material layers 21 are removed, the first regions of the charge trap layer 24 are exposed. For reference, as described above, in the case that the buffer layer 23 is formed along the inner walls of the channel holes, the first material layers 21 are removed to expose the buffer layer 23. Therefore, the first regions of the charge trap layer 24 are exposed by etching the exposed buffer layer 23. At this time, buffer layer patterns 23A remain between the charge trap layer 24 and the second material layers 22. That is, the buffer layer patterns 23A surround the second regions of the charge trap layer 24.

Subsequently, a given thickness of the charge trap layer 24, which is exposed by removing the first material layers 21, is oxidized to form first charge blocking layer patterns 28. When the first charge blocking layer patterns 28 are formed by oxidizing the charge trap layer 24, the interface between the charge trap layer 24 and the first charge blocking layer patterns is not exposed to outside, thus improving interface characteristics.

Since only portions of the charge trap layer 24 which are exposed by removing the first material layers 21 are oxidized, an outer surface of the charge trap layer 24 may have unevenness. For example, the outer surface of the charge trap layer 24 may have unevenness such that the oxidized first regions of the charge trap layer 24 are raised and the second regions are recessed.

As shown in FIG. 2C, the open regions in which the first charge blocking layer patterns 28 are formed are filled with conductive layers 30, and the slits S are filled with insulating layers 31. Here, each of the conductive layers 30 may be used as a word line or a selection line and include a metal layer such as a tungsten layer.

Before the conductive layers 30 are formed, second charge blocking layers 29 may be further formed along inner surfaces of the open regions in which the first charge blocking layer patterns 28 are formed. In this case, the second charge blocking layers 29 are formed between the first charge blocking layer patterns 28 and the conductive layers 30 and between the conductive layers 30 and the second material layers 22. Each of the second charge blocking layers 29 may include a dielectric layer having a high dielectric constant such as an aluminum oxide layer ($Al_2O_3$), or a silicon oxide layer ($SiO_2$) and the dielectric layer that are stacked. By additionally forming the second charge blocking layers 29, erase characteristics may be more improved.

In this manner, memory cells are stacked along the vertical channel layers 26. That is, the conductive layers 30 and the second material layers 22 are stacked alternately over the substrate (not shown). The vertical channel layers 26 protrude from the substrate and pass through the conductive layers 30 and the second material layers 22. The tunnel insulating layers 25 surround the vertical channel layers 26. Charge trap layers 24A surround the tunnel insulating layers 25, and the first regions of each of the charge trap layers 24A between the conductive layers 30 and each of the tunnel insulating layers 25 have a thickness smaller than a thickness of the second regions between the second material layers 22 and each of the tunnel insulating layers 25. The first charge blocking layer patterns 28 surround the first regions of the charge trap layer 24.

According to the first embodiment as described above, charge blocking layers are formed by oxidizing a charge trap layer exposed by removing the first material layers. Therefore, the charge blocking layers may not be formed on surfaces of interlayer insulating layers in open regions, thus reducing the height of stacked layers as compared with that of stacked layers of a conventional three-dimensional (3-D) non-volatile memory device. In addition, quality at the interface between the charge trap layer and the charge blocking layer may be improved.

Figure 3:
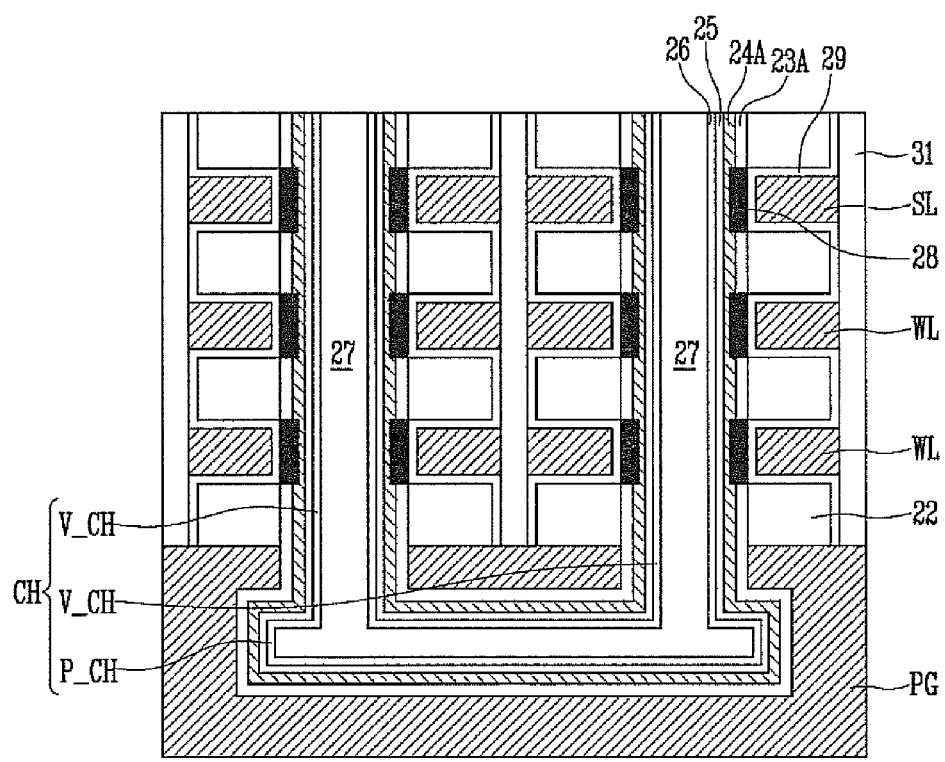
FIGS. 3 and 4 are cross-sectional views of a semiconductor device to which the first embodiment of the present invention is applied.
Figure 4:
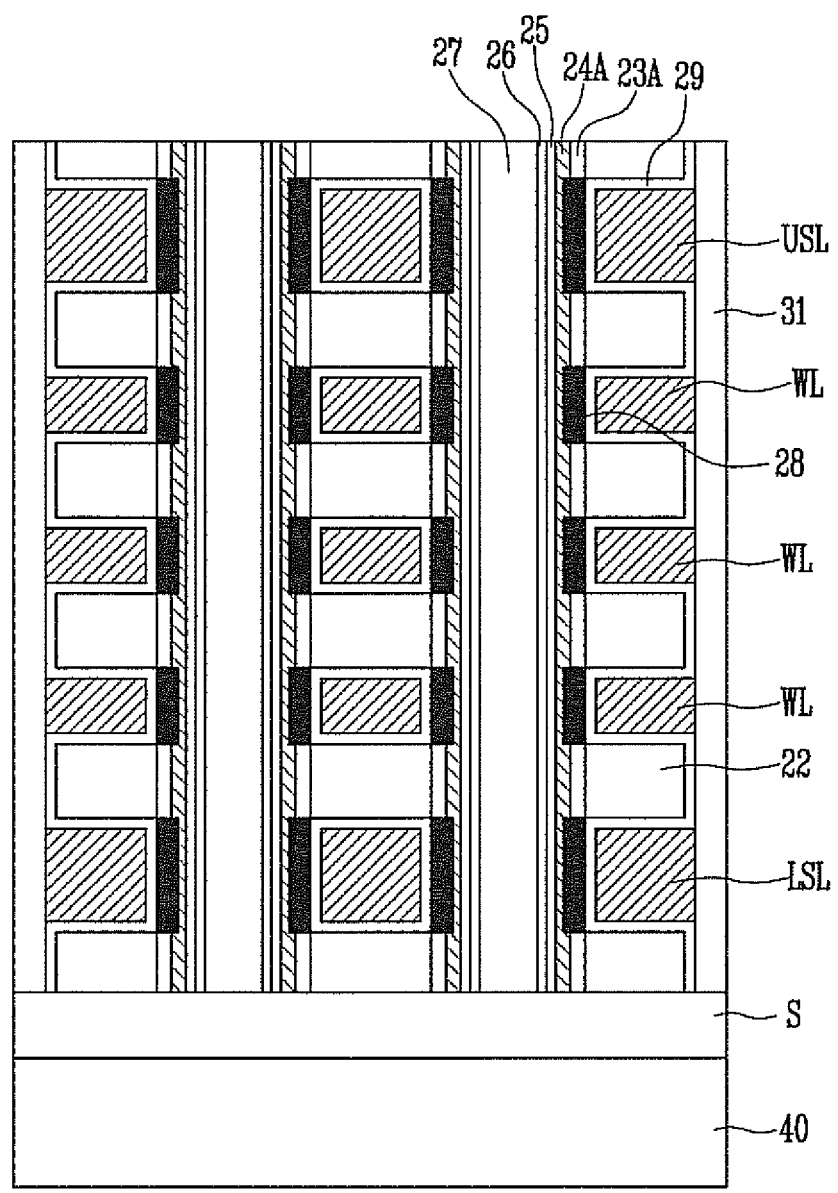

FIGS. 3 and 4 are cross-sectional views of a 3-D non-volatile memory device in which the memory cells are formed according to the first embodiment of the present invention.

As shown in FIG. 3, a three-dimensional non-volatile memory device according to an embodiment of the present includes a pipe gate PG, word lines WL stacked over the pipe gate PG and selection lines SL stacked in at least one layer over the word lines WL. In addition, a channel layer CH of the memory device includes a pipe channel layer P_CH formed in the pipe gate PG and one or more vertical channel layers V_CH that are coupled to the pipe channel layer P_CH. According to this structure of the semiconductor device, a string has a U-shape.

A method of manufacturing the memory device is described briefly below.

First, the pipe gate PG is etched to form trenches. Subsequently, the trenches are filled with sacrificial layers, and the first material layers 21 and the second material layers 22 are alternately formed. Subsequently, the first material layers 21 and the second material layers 22 are etched to form channel holes, which are coupled to the trenches. Here, the channel holes are formed such that each of the trenches may be coupled to at least one pair of the channel holes. Subsequently, the sacrificial layer exposed on bottom surfaces of the channel holes is removed, and a charge trap layer, a tunnel insulating layer and a channel layer are formed on an inner surface of each of the trenches and an inner surface of each of the channel holes. The subsequent processes of forming slits and forming the first charge blocking layer patterns 28 by removing the first material layers 21 may be performed in the same manner as those of the first embodiment.

Here, the tunnel insulating layer 25 and the charge trap layer 24A that surround the vertical channel layer V_CH are formed to further surround the pipe channel layer P_CH. In addition, when the buffer layer 23A is formed between the charge trap layer 24A and the second material 22, the tunnel insulating layer 25, the charge trap layer 24A and the buffer layer 23A may further surround the pipe channel layer P_CH.

Here, the tunnel insulating layer 25, the charge trap layer 24A and the buffer layer 23A that surround the pipe channel layer P_CH are used as a gate insulating layer of a pipe transistor. Therefore, the thickness of the gate insulating layer may be easily controlled by controlling the thickness of the buffer layer 23A.

As shown in FIG. 4, a three-dimensional non-volatile memory device according to another embodiment of the present invention includes at least one layer of a lower selection line LSL, word lines WL and at least one layer of an upper selection line USL that are sequentially stacked over a substrate 40 that includes a source region S.

Here, the lower selection line LSL, the word lines WL and the upper selection line USL may be formed at the same time or at different times. When the lower selection line LSL, the word lines WL and the upper selection line USL are formed at the same time, the tunnel insulating layer 25, the charge trap layer 24A and the first charge blocking layer patterns 28 of a lower selection transistor and an upper selection transistor are used as a gate insulating layer.

Figure 5A:
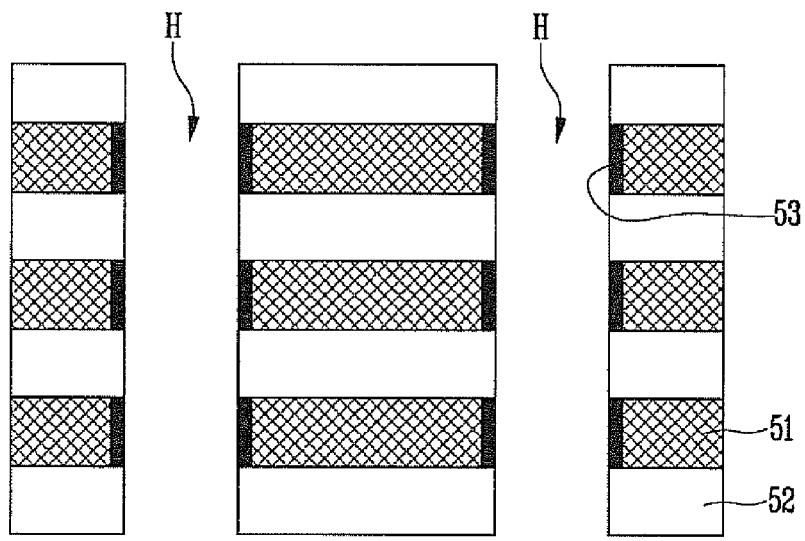
FIGS. 5A to 5C are cross-sectional views illustrating the process flow of a method of manufacturing a semiconductor device according to a second embodiment of the present invention.
Figure 5B:
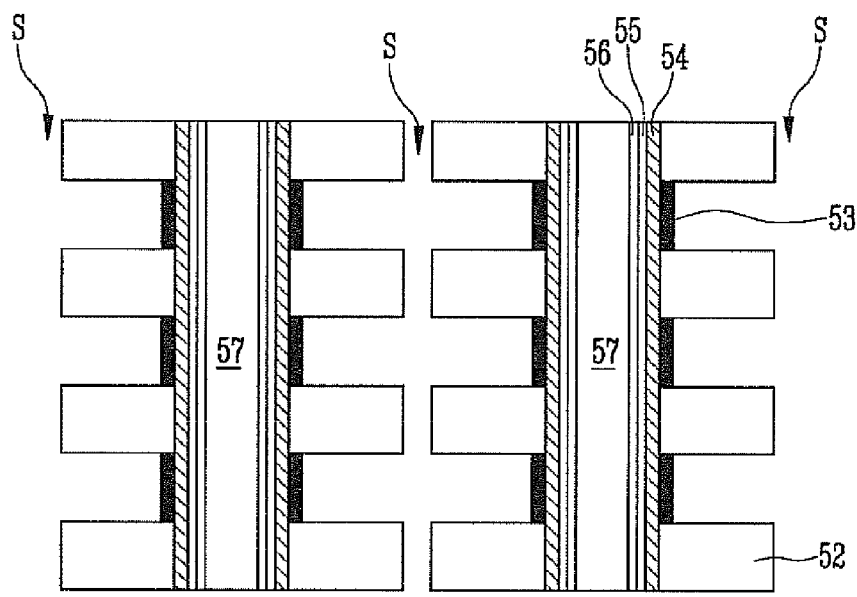
Figure 5C:
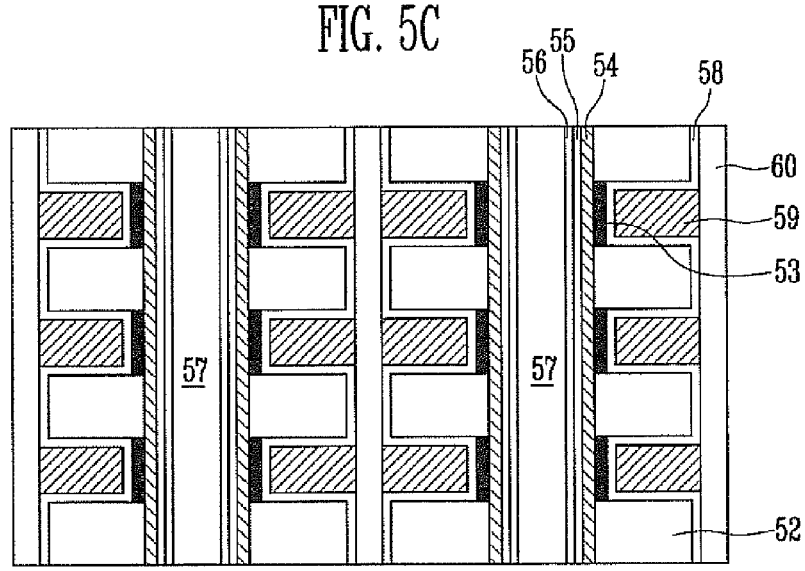

FIGS. 5A to 5C are cross-sectional views illustrating the process flow of a method of manufacturing a semiconductor device according to a second embodiment of the present invention. FIGS. 5A to 5C illustrate a region in which memory cells are stacked. Here, a description of the contents of the second embodiment, which are the same as those of the first embodiment, is omitted.

As shown in FIG. 5A, first material layers 51 and second material layers 52 are formed alternately over a substrate (not shown) in which a given lower structure is formed.

In one example, each of the first material layers 51 may include a conductive layer such as a polysilicon layer, and each of the second material layers 52 may include an insulating layer such as an oxide layer. In another example, each of the first material layers 51 may include a conductive layer such as a doped polysilicon layer or a doped amorphous silicon layer, and each of the second material layers 52 may include a sacrificial layer such as an undoped polysilicon layer or an undoped amorphous silicon layer. In yet another example, each of the first material layers 51 may include a sacrificial layer such as a nitride layer, and each of the second material layers 52 may include an insulating layer such as an oxide layer.

In the second embodiment, the first material layers include sacrificial layers such as nitride layers, and the second material layers 52 include insulating layers such as oxide layers.

Subsequently, the first material layers 51 and the second material layers 52 are etched to form channel holes H, and, a given thickness of each of the first material layers 51 exposed on inner surfaces of the channel holes H is oxidized to thus form first charge blocking layer patterns 53.

At this time, sacrificial layers (not shown) may be formed along inner walls of the channel holes H, and each of the first material layers 51 may be oxidized by a given thickness. Here, each of the sacrificial layers may includes a nitride layer or a silicon layer and have a thickness ranging between 5 and 50 Å. In this case, the first material layers 51 and each sacrificial layer are oxidized at the same time by an oxidation process, and charge blocking layers are further formed by oxidizing the sacrificial layers formed along the inner walls of the channel holes H.

Subsequently, after charge trap layers 54 are formed along the inner walls of the channel holes H, tunnel insulating layers 55 are formed on the charge trap layers 54. Here, each of the tunnel insulating layers 55 may be formed by using a deposition process or by oxidizing a given thickness of each of the charge trap layers 54.

Subsequently, after vertical channel layers 56 are formed on the tunnel insulating layers 55, open central portions of the vertical channel layers 56 are filled with insulating layers 57 such as fluid oxide layers.

As shown in FIG. 5B, the first material layers 51 and the second material layers 52 are etched to form slits S between the vertical channel layers 56. Subsequently, the first material layers 51 exposed on inner walls of the slits S are selectively removed to form open regions. Here, the first charge blocking layer patterns 53 are not removed and remain.

For example, when the first material layers 51 include nitride layers, and the first charge blocking layer patterns 53 comprise oxide layers, the first material layers 51 may be selectively removed by using phosphoric acid. At this time, the first charge blocking layer patterns 53 are not etched and remain. The first charge blocking layer patterns 53, formed by an oxidation process, have a lower etch rate than charge blocking layers formed by using a deposition process. Therefore, the first charge blocking layer patterns 53 may be prevented from being damaged when the first material layers 51 are removed.

As shown in FIG. 5C, second charge blocking layers 58 may be formed along inner surfaces of the open regions. At this time, the first charge blocking layer patterns 53 may be removed before the second charge blocking layers 58 are formed.

Subsequently, the open regions in which the second charge blocking layers 58 are formed are filled with conductive layers 59, and the slits S are filled with insulating layers 60. As a result, memory cells are stacked along the vertical channel layers 56.

According to the second embodiment, each of the first material layers 51 may include a conductive layer such as a polysilicon layer, and each of the second material layers 52 may include an insulating layer such as an oxide layer. In this case, each of the first material layers 51 comprising the conductive layers may be oxidized by a given thickness to form the first charge blocking layer patterns 53. In addition, after the slits S are formed, the first material layers 51 exposed through the slits S are not removed and silicided. Subsequently, the slits S are filled with the insulating layers 60, completing the processes of manufacturing the memory cells.

In addition, according to the second embodiment, the first material layers 51 may include conductive layers such as a doped polysilicon layer, and the second material layers 52 may include sacrificial layers such as an undoped polysilicon layer. In this case, a given thickness of each of the first material layers 51 comprising the conductive layer may be oxidized to form the first charge blocking layer patterns 53. In addition, after the slits S are formed, the second material layers 52 may be removed instead of the first material layers 51. Subsequently, the slits S and regions from which the second material layers 52 are removed are filled with the insulating layers 60, completing the processes of manufacturing the memory cells.

Here, during the process of oxidizing the given thickness of each of the first material layers 51, each of the second material layers 52 may also be oxidized by a given thickness. The oxidized portion may remain or be removed at the same time as the second material layers 52 are removed. Since the oxidized portion serves as an interlayer insulating layer even though it remains, the oxidized portions may not affect characteristics of the memory device.

Figure 6:
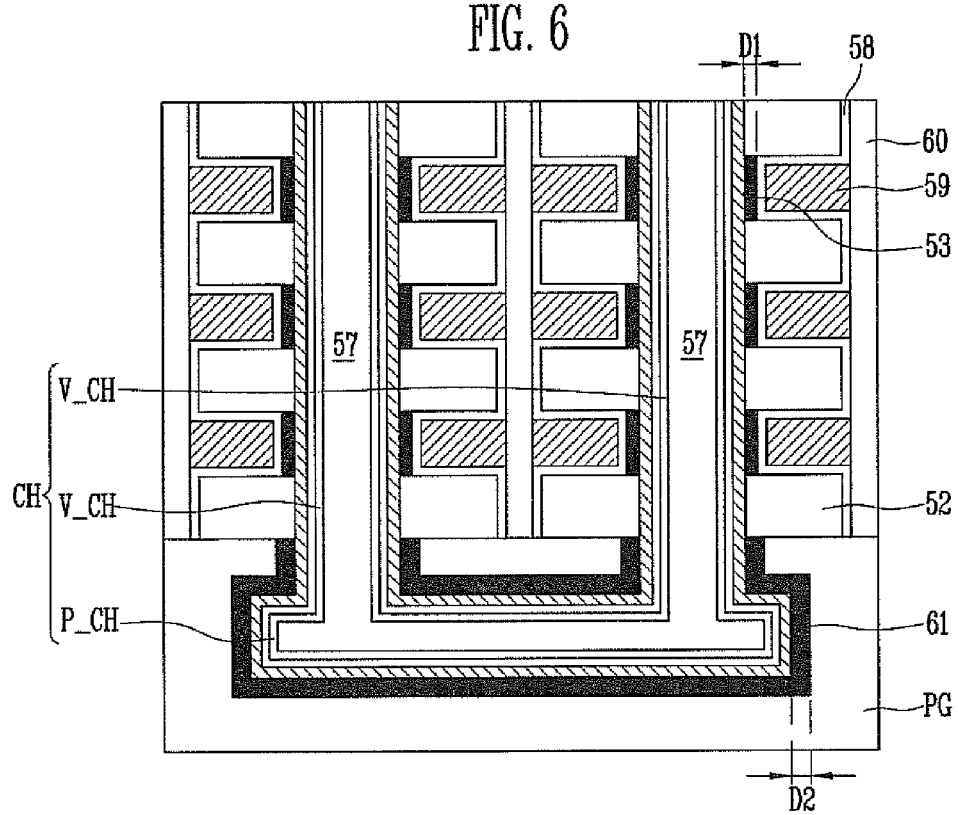
FIGS. 6 and 7 are cross-sectional views of a semiconductor device to which the second embodiment of the present invention is applied.
Figure 7:
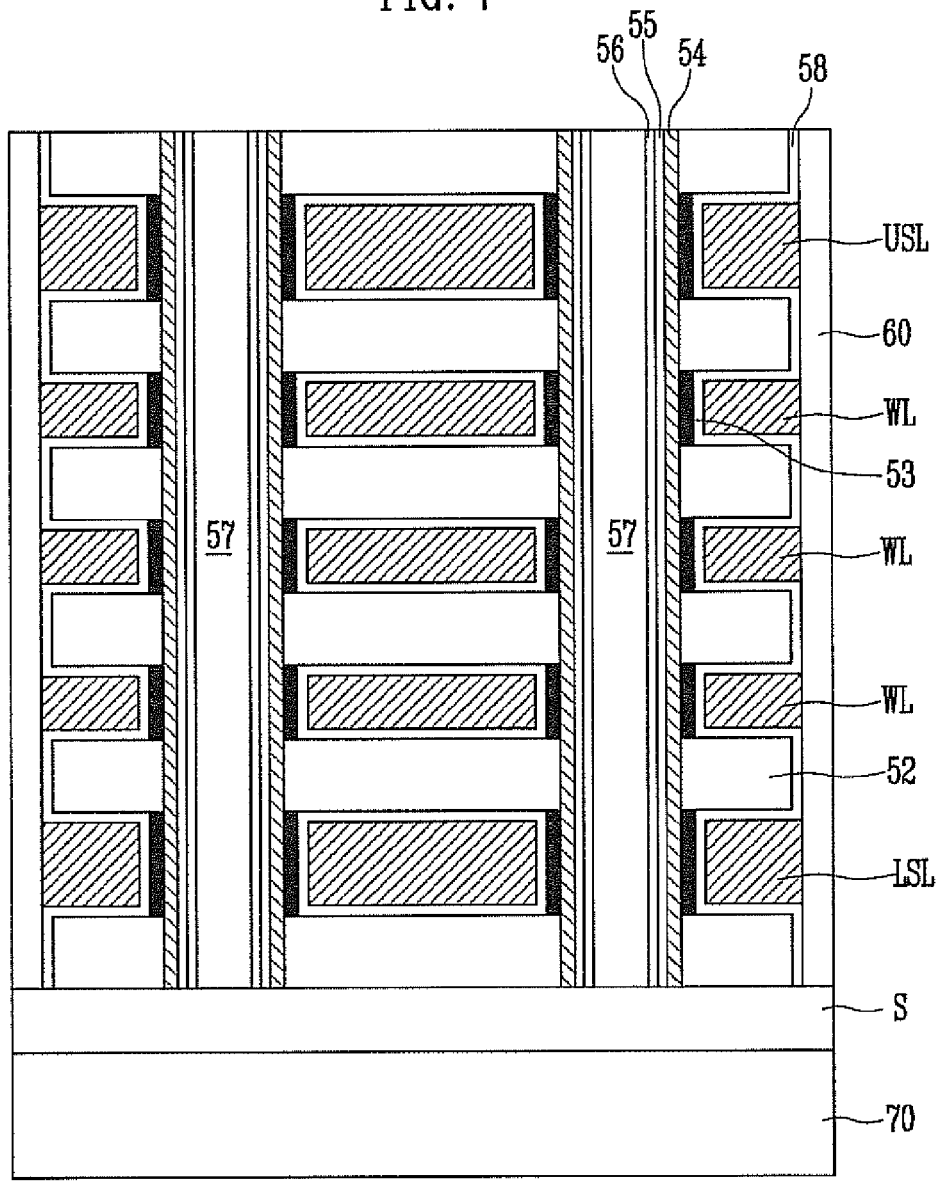

FIGS. 6 and 7 are cross-sectional views of a 3-D non-volatile memory device in which the memory cells are formed according to the second embodiment. Here, a description of the contents of the second embodiment, which are the same as those of the first embodiment, is omitted.

As shown in FIG. 6, a 3-D non-volatile memory device to which the second embodiment of the present invention is applied may include the pipe gate PG and the pipe channel layer P_CH that is formed in the pipe gate PG. The 3-D non-volatile memory device may further include the tunnel insulating layer 55, the charge trap layer 54 and a gate insulating layer 61 that surround the pipe channel layer P_CH.

Here, the gate insulating layer 61 is formed at the same time as the first charge blocking layer patterns 53 are formed. For example, after the channel holes H are formed, the sacrificial layer filling the trench of the pipe gate PG may be removed. Subsequently, each of the first material layers 51 exposed on inner surfaces of the channel holes H is oxidized by a given thickness by using an oxidation process, and at the same time, a pipe gate conductive layer exposed on an inner surface of the trench is oxidized by a given thickness. As a result, the first charge blocking layer patterns 53 and the gate insulating layer 61 may be formed at the same time.

For example, when each of the first material layers 51 includes a nitride layer, and the pipe gate conductive layer includes a polysilicon layer, the pipe gate conductive layer is oxidized about 1.5 times faster than the first material layer 51. Therefore, the gate insulating layer 61 may have a thickness D2 greater than a thickness D1 of each of the first charge blocking layer patterns 53 (D1<D2), thus improving characteristics of a pipe transistor.

As shown in FIG. 7, a 3-D non-volatile memory device to which the second embodiment of the present invention is applied may include at least one layer of the lower selection line LSL, the word lines WL and at least one layer of the upper selection line USL that are sequentially stacked over a substrate 70 that includes the source region S.

Here, a lower selection transistor and an upper selection transistor use as a gate insulating layer, the tunnel insulating layer 55, the charge trap layer 54, the first charge blocking layer patterns 53 and the second charge blocking layer 58 that surround the vertical channel layer 56.

Figure 8A:
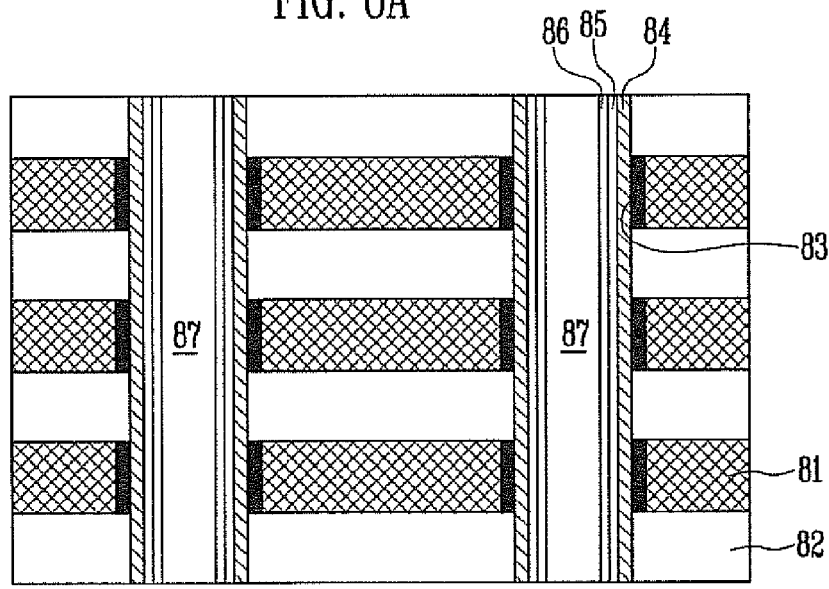
FIGS. 8A to 8C are cross-sectional views illustrating the process flow of a method of manufacturing a semiconductor device according to a third embodiment of the present invention.
Figure 8B:
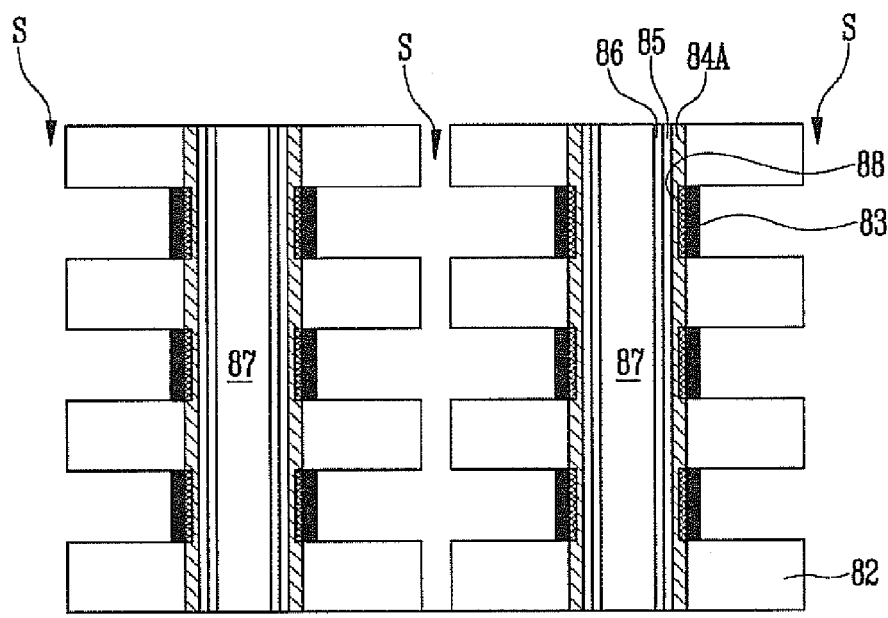
Figure 8C:
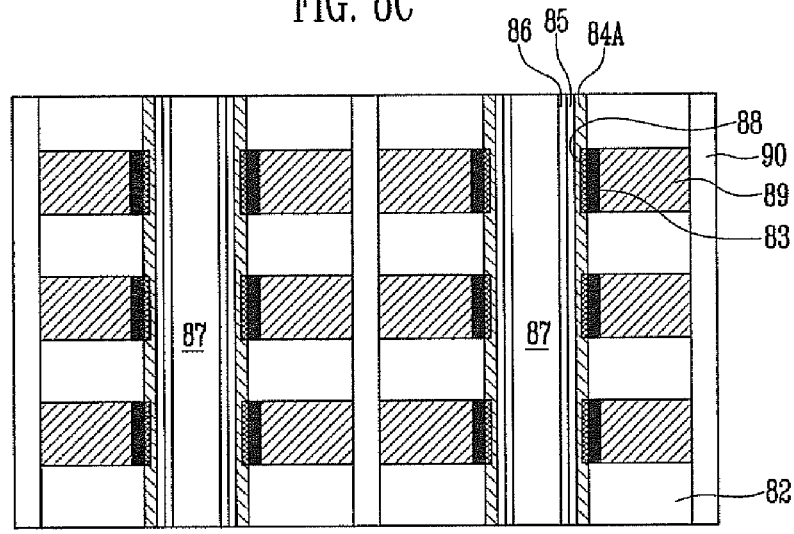

FIGS. 8A to 8C are cross-sectional views illustrating the process flowing of a method of manufacturing a semiconductor device according to a third embodiment of the present invention. FIGS. 8A to 8C illustrate a region in which memory cells are stacked. A description of the contents of the third embodiment, which are the same as those of the first and second embodiments, is omitted.

As shown in FIG. 8A, first material layers 81 and second material layers 82 are formed alternately over a substrate (not shown) in which a given lower structure is formed. In the third embodiment, each of the first material layers 81 includes a sacrificial layer such as a nitride layer, and each of the second material layers 82 includes an insulating layer such as an oxide layer.

Subsequently, the first material layers 81 and the second material layers 82 are etched to form channel holes, and each of the first material layers 81 exposed on inner surfaces of the channel holes is oxidized by a given thickness. In this manner, first charge blocking layer patterns 83 are formed.

Subsequently, charge trap layers 84, tunnel insulating layers 85 and vertical channel layers 86 are formed along inner walls of the channel holes. When the vertical channel layers 86 have open central regions, the open central regions are filled with insulating layers 87 such as flowable oxide layers.

As shown in FIG. 8B, the first material layers 81 and the second material layers 82 are etched to form the slits S between the channel holes. Subsequently, the first material layers 81 exposed on inner walls of the slits S are selectively removed to form open regions.

Subsequently, a surface of the charge trap layer 84 that adjoins the first charge blocking layer patterns 83 is oxidized by a given thickness by using an oxidation process, thus forming second charge blocking layer patterns 88. Therefore, charge trap layers 84A have first regions and second regions each having a greater thickness than the first regions. In addition, the second charge blocking layer patterns 88 are formed to surround the first regions of the charge trap layer 84A.

As shown in FIG. 8C, after the open regions are filled with conductive layers 89, each of the slits S is filled with an insulating layer 90. At this time, before the open regions are filled with the conductive layers 89, third charge blocking layers (not shown) may be further formed along inner surfaces of the open regions. In this manner, memory cells are stacked along the vertical channel layers 86.

Figure 9:
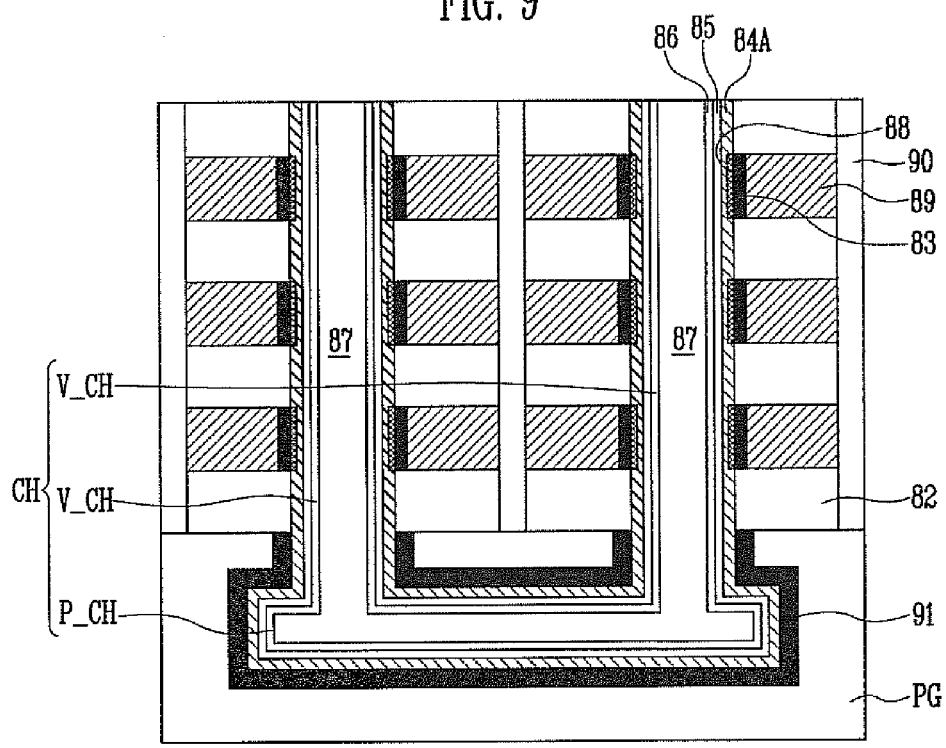
FIGS. 9 and 10 are cross-sectional views of a semiconductor device to which the third embodiment of the present invention is applied.
Figure 10:
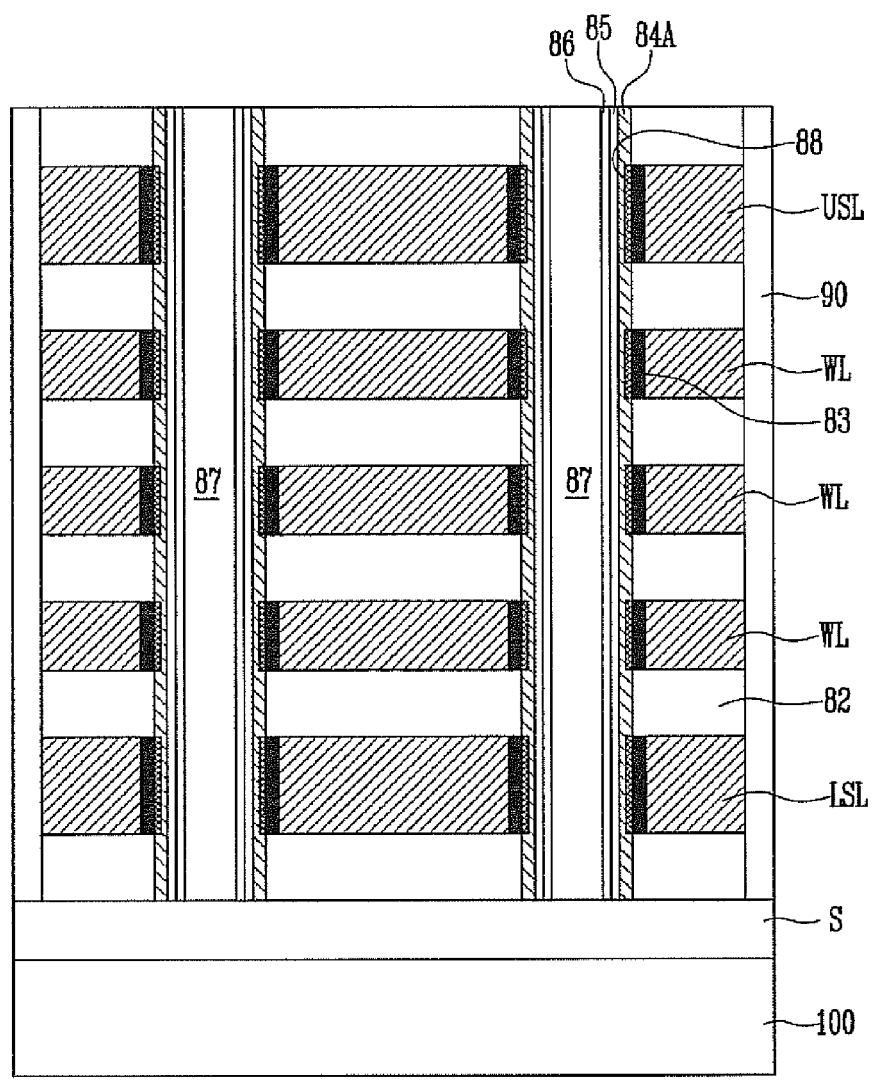

FIGS. 9 and 10 are cross-sectional views of a 3-D non-volatile memory device in which the memory cells are formed according to the third embodiment of the present invention. Here, a description of the contents of the third embodiment, which are the same as those of the first and second embodiments, is omitted.

As shown in FIG. 9, the 3-D non-volatile memory device to which the third embodiment of the present invention is applied may include the pipe gate PG and the pipe channel layer P_CH that is formed in the pipe gate PG. The 3-D non-volatile memory device may further include the tunnel insulating layer 85, the charge trap layer 84A and a gate insulating layer 91 that surround the pipe channel layer P_CH.

As shown in FIG. 10, the 3-D non-volatile memory device to which the third embodiment of the present invention is applied may include at least one layer of the lower selection line LSL, the word lines WL and at least one layer of the upper selection line USL that are sequentially stacked over a substrate 100 that includes the source region S.

Here, a lower selection transistor and an upper selection transistor use as a gate insulating layer, the tunnel insulating layer 85, the charge trap layer 84A, the first charge blocking layer patterns 83 and the second charge blocking layer patterns 88 that surround the vertical channel layer 86.

Figure 11:
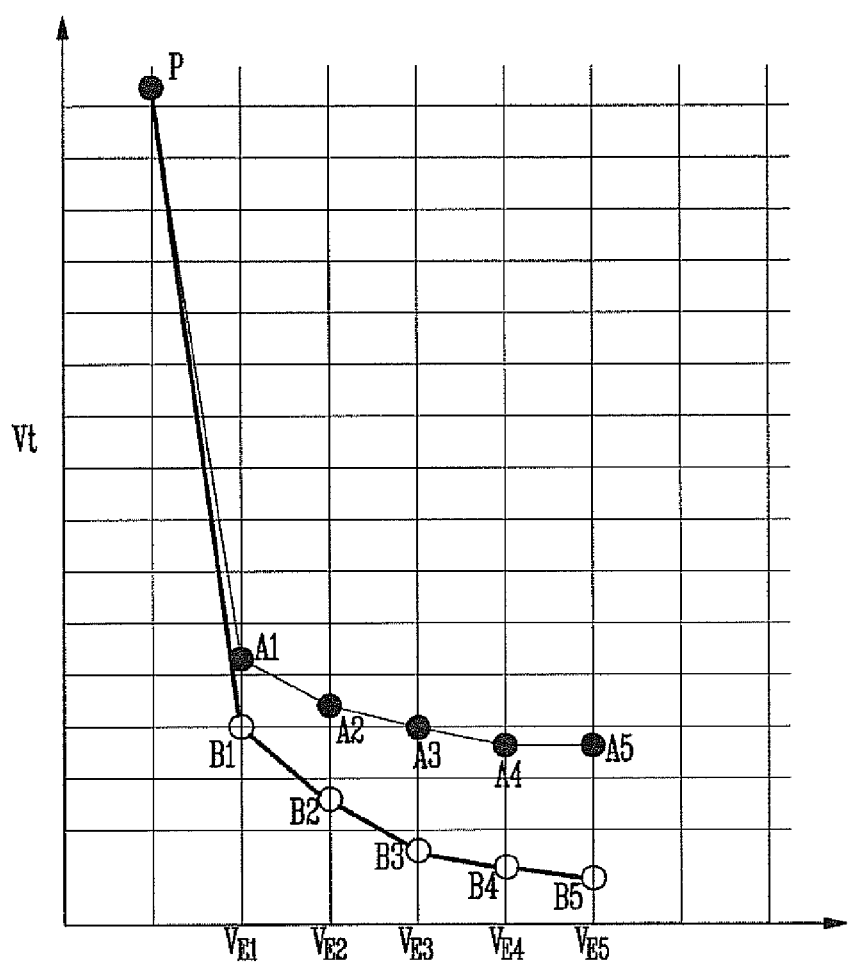
FIG. 11 is a graph illustrating erase characteristics of a semiconductor device to which at least one of the first to third embodiments of the present invention is applied.

FIG. 11 is a graph showing erase characteristics of a semiconductor device to which at least one of the first to third embodiments is applied. In particular, the graph in FIG. 11 shows a shift in threshold voltages in response to erase voltages. In FIG. 11, the x-axis represents levels of an erase voltage that is applied during an erase operation, and the y-axis represents threshold voltages of memory cells.

In FIG. 11, A1 to A5 indicate erase states of memory cells when a charge blocking layer is formed by using a deposition method to show erase characteristics of a conventional semiconductor device, and B1 to B5 indicate erase states of memory cells when a charge blocking layer is formed by using an oxidation method. In addition, $V_{E1}$, $V_{E2}$, $V_{E3}$, $V_{E4}$ and $V_{E5}$ are erase voltages ($V_{E1} < V_{E2} < V_{E3} < V_{E4} < V_{E5}$).

The threshold voltages of the memory cells are increased during a program operation. In addition, when an erase voltage is applied to a source line or a source region during an erase operation, the threshold voltages of the memory cells of a program state P are reduced and become of erase states A1 to A5 and B1 to B5.

Here, a variation range of the threshold voltages of the memory cells may vary depending on the quality of the charge blocking layer and interface characteristics between the charge trap layer and the charge blocking layer. That is, as the quality of the charge blocking layer and the interface characteristics between the charge trap layer and the charge blocking layer are improved, the variation range of threshold voltages may be increased during the erase operation, thus improving erase characteristics of the memory device.

Referring to the graph in FIG. 11, when the charge blocking layer is formed by using the oxidation method, the threshold voltage of the memory cell sharply decreases during an erase operation as compared with when the charge blocking layer is formed by using the deposition method. In addition, as the level of the erase voltage is increased, the difference between the threshold voltages of the oxidation method and the deposition method may be further increased. Therefore, when a semiconductor device is manufactured by using at least one of the first to third embodiments of the present invention, operating characteristics of the memory device may be improved.

Figure 12:
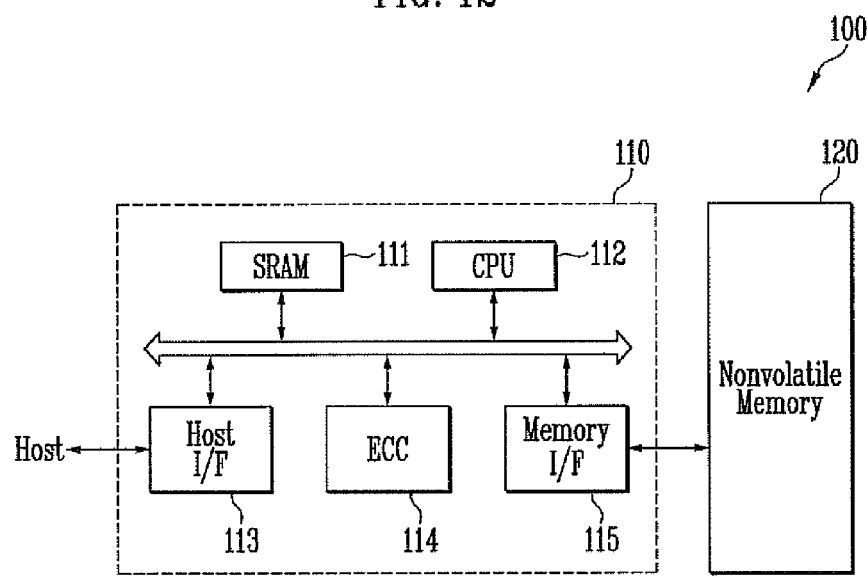
FIG. 12 is a block diagram illustrating the configuration of a memory system according to an embodiment of the present invention.

FIG. 12 is a diagram illustrating the configuration of a memory system according to an embodiment of the present invention.

As shown in FIG. 12, a memory system 100 according to an embodiment of the present invention includes a non-volatile memory device 120 and a memory controller 110.

The non-volatile memory device 120 may include the memory cells described with reference to the first to third embodiments. In addition, the non-volatile memory device 120 may be a multi-chip package that includes a plurality of flash memory chips.

The memory controller 110 is configured to control the non-volatile memory device 120. The memory controller 110 may include an SRAM 111, a Central Processing Unit (CPU) 112, a host interface (I/F) 113, an ECC circuit 114 and a memory I/F 115. The SRAM 111 is used as an operating memory of the CPU 112. The CPU 112 performs an overall control operation for the data exchange of the memory controller 110. The host I/F 113 may include a data exchange protocol of a host that is coupled to the memory system 100. In addition, the ECC circuit 114 detects and corrects errors included in data read out from the non-volatile memory device 120. The memory I/F 115 interfaces the memory controller 110 with the non-volatile memory device 120. The memory controller 110 may further include RCM for storing code data for an interface with the host.

The memory system 100 configured as above may be a memory card or a Solid State Disk (SSD) in which the non-volatile memory device 120 and the controller 110 are combined. For example, if the memory system 100 is an SSD, the memory controller 110 may communicate with the outside (e.g., a host) through one of various interface protocols, such as USB, MMC, PCI-E, SATA, PATA, SCSI, ESDI, and IDE.

Figure 13:
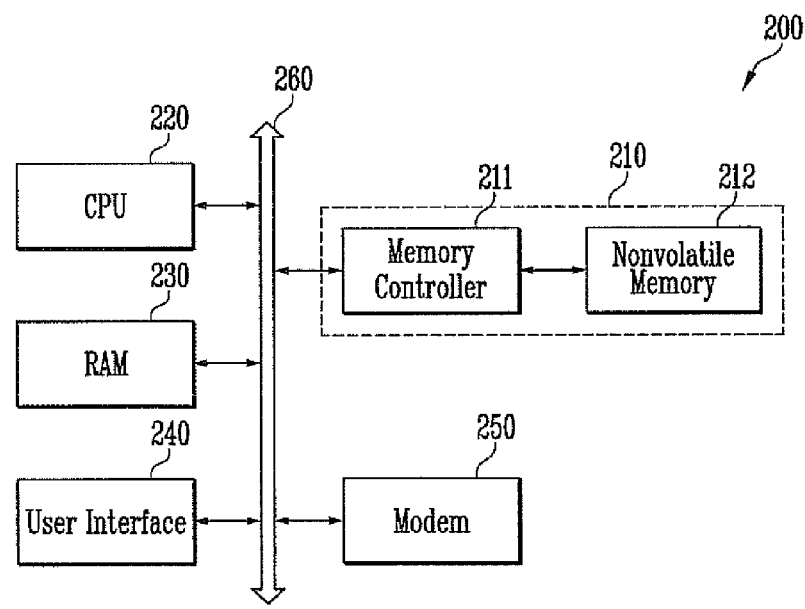
FIG. 13 is a block diagram illustrating a computing system according to an embodiment of the present invention.

FIG. 13 is a diagram illustrating the configuration of a computing system according to an embodiment of the present invention.

As shown in FIG. 13, a computing system 200 may include a CPU 220, RAM 230, a user interface 240, a modem 250, and a memory system 210 that are electrically coupled to a system bus 260. When the computing system 200 is a mobile device, the computing system 200 may further include a battery for supplying an operating voltage to the computing system 200. The computing system 200 may further include application chipsets, a Camera Image Processor (CIS), mobile DRAM, and so on.

The memory system 210 may include a non-volatile memory device 212 and a memory controller 211 as described above in connection with FIG. 12.

According to an embodiment of the present invention, a semiconductor device includes a charge blocking layer that is formed by oxidizing a given thickness of a first material layer or a charge trap layer. Therefore, as compared with a conventional semiconductor device, the height of stacked layers may be reduced, thus increasing an integration degree of a memory device. In addition, a charge blocking layer is formed by using an oxidation method, so that quality of the charge blocking layer may be improved, and interface characteristics between the charge trap layer and the charge blocking layer may be improved, thus improving operating characteristics of a memory device.

What is claimed is:

1. A semiconductor device, comprising:
   word lines and interlayer insulating layers alternately stacked over a substrate;
   vertical channel layers protruding from the substrate and passing through the word lines and the interlayer insulating layers;
   a tunnel insulating layer surrounding each of the vertical channel layers;
   a charge trap layer surrounding the tunnel insulating layer, wherein first regions of the charge trap layer between the tunnel insulating layer and the word lines have a thickness smaller than a thickness of second regions thereof between the tunnel insulating layer and the interlayer insulating layers;
   first charge blocking layer patterns surrounding the first regions of the charge trap layer and interposed only between the charge trap layer and the word lines; and
   second charge blocking layer patterns interposed only between the first regions of the charge trap layer and the first charge blocking layer patterns.

2. The semiconductor device of claim 1, wherein the charge trap layer includes grooves on an outer surface and the second charge blocking layer patterns are formed within the grooves.

3. The semiconductor device of claim 1, wherein an outer surface of the charge trap layer has unevenness and an inner surface of the charge trap layer is flat.

4. The semiconductor device of claim 1, wherein the word lines and interlayer insulating layers directly contact each other.

5. The semiconductor device of claim 1, further comprising:
   a pipe gate formed between the substrate and the stacked word lines and interlayer insulting layers; and
   a pipe channel layer formed in the pipe gate, coupled to the vertical channel layers and surrounded by the tunnel insulating layer and the charge trap layer.

6. The semiconductor device of claim 5, further comprising buffer layer patterns interposed between the charge trap layer and the interlayer insulating layers and between the charge trap layer and the pipe gate.

7. The semiconductor device of claim 5, further comprising a gate insulating layer interposed between the charge trap layer and the pipe gate.

8. The semiconductor device of claim 1, further comprising:
   at least one layer of an upper selection line formed over the stacked word lines; and
   at least one layer of a lower selection line formed under the stacked word lines.

9. The semiconductor device of claim 1, further comprising buffer layer patterns surrounding the second regions of the charge trap layer.

* * * * *